US009847783B1

(12) United States Patent
Teh et al.

(10) Patent No.: US 9,847,783 B1
(45) Date of Patent: Dec. 19, 2017

(54) SCALABLE ARCHITECTURE FOR IP BLOCK INTEGRATION

(71) Applicant: Altera Corporation, San Jose, CA (US)

(72) Inventors: Chee Hak Teh, Bayan Lepas (MY); Arifur Rahman, San Jose, CA (US); Richard Arthur Grenier, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/882,065

(22) Filed: Oct. 13, 2015

(51) Int. Cl.
*H01L 25/00* (2006.01)
*H03K 19/177* (2006.01)

(52) U.S. Cl.
CPC ... *H03K 19/1776* (2013.01); *H03K 19/17736* (2013.01)

(58) Field of Classification Search
None
See application file for complete search history.

(56) References Cited

U.S. PATENT DOCUMENTS

| | | | |
|---|---|---|---|
| 5,457,410 A | 10/1995 | Ting | |
| 6,604,230 B1 | 8/2003 | Khalid et al. | |
| 6,842,034 B1 * | 1/2005 | Chan | H03K 19/17732 326/37 |
| 7,536,669 B1 | 5/2009 | Anderson | |
| 8,159,973 B2 | 4/2012 | Deng et al. | |
| 8,201,129 B2 | 6/2012 | Lee et al. | |
| 2006/0119384 A1 * | 6/2006 | Camarota | G06F 15/7867 326/38 |
| 2016/0026742 A1 * | 1/2016 | Schelle | G06F 17/5068 711/104 |

* cited by examiner

*Primary Examiner* — Anh Tran
(74) *Attorney, Agent, or Firm* — Treyz Law Group, P.C.; Vineet Dixit

(57) ABSTRACT

A scalable circuit architecture for programmable circuitry is provided. Intellectual property (IP) blocks may be integrated into a circuit design and may be formed next to programmable logic sectors on which user logic functions are implemented. IP blocks may receive configuration data from sub-system managers (SSMs) that serve as a local configuration source for the IP blocks. Configurable endpoints in the IP blocks may be represented by memory mapped addresses that may be decoded by pipeline decoders having delay elements that prevent read data collision. A reroute layer may serve as an interface between IP blocks and one or more programmable logic sectors. The reroute layer may have a higher number of connections at a logic sector interface compared to the number of connections at an IP block interface. An IP block may route clock signals having different frequencies to respective different rows or regions in the programmable logic sectors.

17 Claims, 6 Drawing Sheets

SCALABLE ARCHITECTURE FOR IP BLOCK INTEGRATION

BACKGROUND

This invention relates to an architecture for integrated circuits having intellectual property (IP) blocks, and more particularly, to circuitry that supports the embedding of large IP blocks into programmable circuitry.

Programmable integrated circuits are a type of integrated circuit that can be programmed by a user to implement a desired custom logic function. In a typical scenario, a logic designer uses computer-aided design tools to design a custom logic circuit that performs custom logic functions. As the complexity of design that computer-aided design tools are capable of realizing increases, the number of interconnections between circuit elements on an integrated circuit rapidly increases in magnitude.

Intellectual property (IP) blocks correspond to circuitry with a lesser degree of programmability and configurability than logic fabric in programmable circuitry. The integration of large IP blocks that are used or utilized by user logic regions in the programmable circuitry often causes degraded timing closure, which limits the performance of programmable circuitry.

User logic regions require interconnections between themselves (i.e., between individual logic sectors in the user logic regions) and also require interconnections to the IP blocks that are formed adjacent to the user logic regions. Often, only a limited region around IP blocks is available for routing interconnections between the logic regions to the IP blocks. These limitations, on the area in which interconnects can be routed, often cause interconnect routing congestion which limits the maximum achievable performance of programmable circuitry. Conventional architectures for designing programmable circuitry place IP blocks in a manner that results in interconnect congestion or blockages where a high volume of interconnections are routed through a limited area in order to communicate with IP blocks. Moreover, interconnections such as vertical interconnections (or, V-wires) have a finite, or limited, availability in a given area, which may be exhausted due to routing congestion that results from traditional architectures, further limiting the achievable functionality in a programmable circuit design that interfaces with IP blocks.

Therefore, improved architectures for integrating IP blocks into programmable circuitry are required.

SUMMARY

A scalable circuit architecture for programmable circuitry is provided. The architecture is not limited to any particular structure, but is adaptable to integrated circuit designs implemented on a single die, a multiple-layer die, or a multiple-die design.

An integrated circuit may have components or logic regions that are connected using paths formed of routing resources, which are interchangeably referred to as interconnections or segments. Many different types of interconnections may be formed on an interconnection circuit. A given region of an integrated circuit may have a limited capacity to form a maximum amount of interconnections of a given type.

Routing congestion may occur when a number of interconnects that is formed in a given region of the integrated circuit, approaches a maximum interconnect capacity of the region. In large programmable integrated circuits, such as FPGAs, intellectual property (IP) blocks may be integrated into circuit designs. IP blocks are very difficult, if not impossible, to customize or tailor to suit a pre-existing architecture. Based on when one or more IP blocks are included or integrated into a circuit design, an IP block may be a late binding feature. To improve the adaptability of a circuit design to the inclusion of an IP block, an architecture that supports IP blocks with adaptable configuration control circuitry, connection routing layer, pipeline stages, and multi-rate clocking is described.

IP blocks may receive configuration data from sub-system managers (SSMs). SSMs may be interposed between more than one IP block, or may more generally be formed adjacent to an IP block. An IP block may receive configuration messages from the SSM, and may also be calibrated by the SSM. An IP block may have multiple endpoints that are each assigned an address in a memory mapped address space. Endpoints (sometimes referred to as "endpoint circuits") may correspond to circuits having different implementations between specific types of IP blocks, but may generally refer to circuitry in an IP block that Subsets of the multiple endpoints may be assigned to a common address when it is desired to write or access the subsets simultaneously.

Pipeline decoder stages may be coupled to, and used to address groups of the endpoints. Specifically, the memory mapped addresses used to address the endpoints are decoded by the pipeline decoder stages. Memory mapped addresses for the endpoints may be used for writing to or reading from the endpoints in the IP block. Endpoints in the IP block may also have data that is read by the SSM in calibration modes or to confirm that the configuration was successful. To prevent data collision when routing read data from the endpoints to the SSM, the pipeline decoders that route the read data may include programmable delay elements that can be configured to exhibit variable delays. The amount of delay provided by the programmable delay elements in the pipeline decoders may be based on the distance of the pipeline decoder from the SSM.

Some IP blocks may have blocked connections. Specifically, when a region of an IP block does not have a connection that is adjacent to a sector in logic fabric, the connection for the region of the IP block may be considered to be a blocked connection. Moreover, IP blocks may have connections with specific predetermined spacing between the connections. This spacing between connections in the IP block may be difficult to configure, and may be different than the spacing and even location of connections from user logic in the programmable circuitry. A reroute layer that has a higher density of connections at a logic sector interface may be capable of routing signals from specifically spaced connections in the IP block at a first reroute layer interface to unblocked connections to logic sectors in the logic fabric at a second reroute layer interface. The density of connection terminals at a logic sector interface of a reroute layer may be based on the ratio of connection terminals at the logic sector interface of the reroute layer and the length of the logic sector interface of the reroute layer. Similarly, the density of connection terminals at an IP block interface of the reroute layer may be based on the ratio of connection terminals at the reroute layer and the length of the IP block interface of the reroute layer. The reroute layer may be pipelined.

An IP block may be configured based on a configuration clock in the SSM, but may include a functional clock that is used during operation of the IP block. A clock in the IP block may generate a full rate clock, and one or more divide-by-N rate clocks. The full rate clock generated by the IP block clock may be routed to logic sectors in a first region that is adjacent to the IP block. A first divide-by-N clock having a frequency that is less than the frequency of the full rate clock may be routed to logic sectors in a second region that is adjacent to the first region and that is further from the IP block than the first region. A second divide-by-N clock having a frequency that is less than the frequency of the first divide-by-N rate clock may be routed to logic sectors in a third region that is adjacent to the second region and that is further from the IP block than the second region. Generally, as the clock frequency of a given clock signal decreases, the distance from the IP block to which the given clock signal can be routed while still meeting the timing margin may increase.

DETAILED DESCRIPTION

Figure 1:
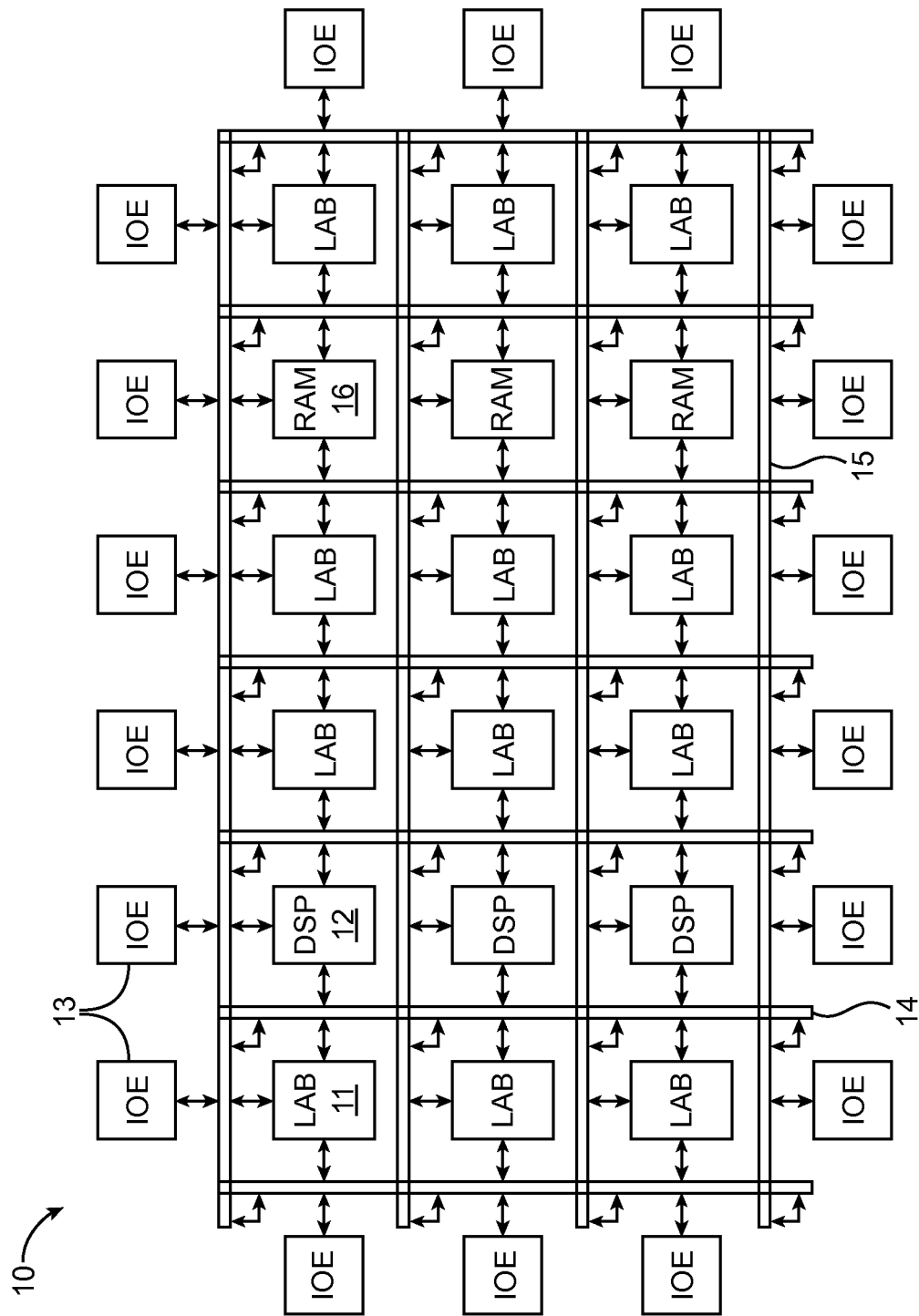
FIG. 1 is a diagram of an illustrative integrated circuit with embedded configurable storage circuit that may be designed using programmable logic design software in accordance with an embodiment.

An illustrative embodiment of an integrated circuit such as a programmable logic device (PLD) 10 that may be designed using computer-aided design tools is shown in FIG. 1. Programmable logic device 10 may have input-output (I/O) circuitry 13 for driving signals off of PLD 10 and for receiving signals from other devices. Input-output (I/O) circuitry 13 may include conventional input-output (I/O) circuitry, serial data transceiver circuitry, differential receiver and transmitter circuitry, or other circuitry used to connect one integrated circuit to another integrated circuit.

Programmable logic regions may include programmable components such as digital signal processing circuitry 12, storage circuitry 16, or other combinational and sequential logic circuitry organized in logic array blocks (LABs) 11. The programmable logic regions may be configured to perform a custom logic function. If desired, the programmable logic region may include digital signal processing circuitry 12 and storage circuitry 16 which both may be organized in specialized blocks that have limited configurability. The programmable logic region may include additional specialized blocks such as programmable phase-locked loop circuitry, programmable delay-locked loop circuitry, or other specialized blocks with limited configurability.

The circuitry of programmable logic device 10 may be organized using any suitable architecture. As an example, the logic of programmable logic device 10 may be organized in a series of rows and columns of larger programmable logic regions each of which contains multiple smaller logic regions. The smaller regions may be, for example, regions of logic that are sometimes referred to as logic elements (LEs) or basic logic elements (BLEs), each containing a look-up table, one or more registers, and programmable multiplexer circuitry. The smaller regions may also be, for example, regions of logic that are sometimes referred to as adaptive logic modules (ALMs), configurable logic blocks (CLBs), slice, half-slice, etc. Each adaptive logic module may include a pair of adders, a pair of associated registers and a look-up table or other block of shared combinational logic (i.e., resources from a pair of LEs—sometimes referred to as adaptive logic elements or ALEs in this context). The larger regions may be, for example, logic array blocks (LABs) or logic clusters of regions of logic containing multiple logic elements or multiple ALMs. The LABs 11 may also be referred to as "logic sectors," or "sectors of logic fabric." Generally, regions in PLD 10 that contain multiple LABs may be referred to as the "logic fabric" of the PLD 10.

Figure 2:
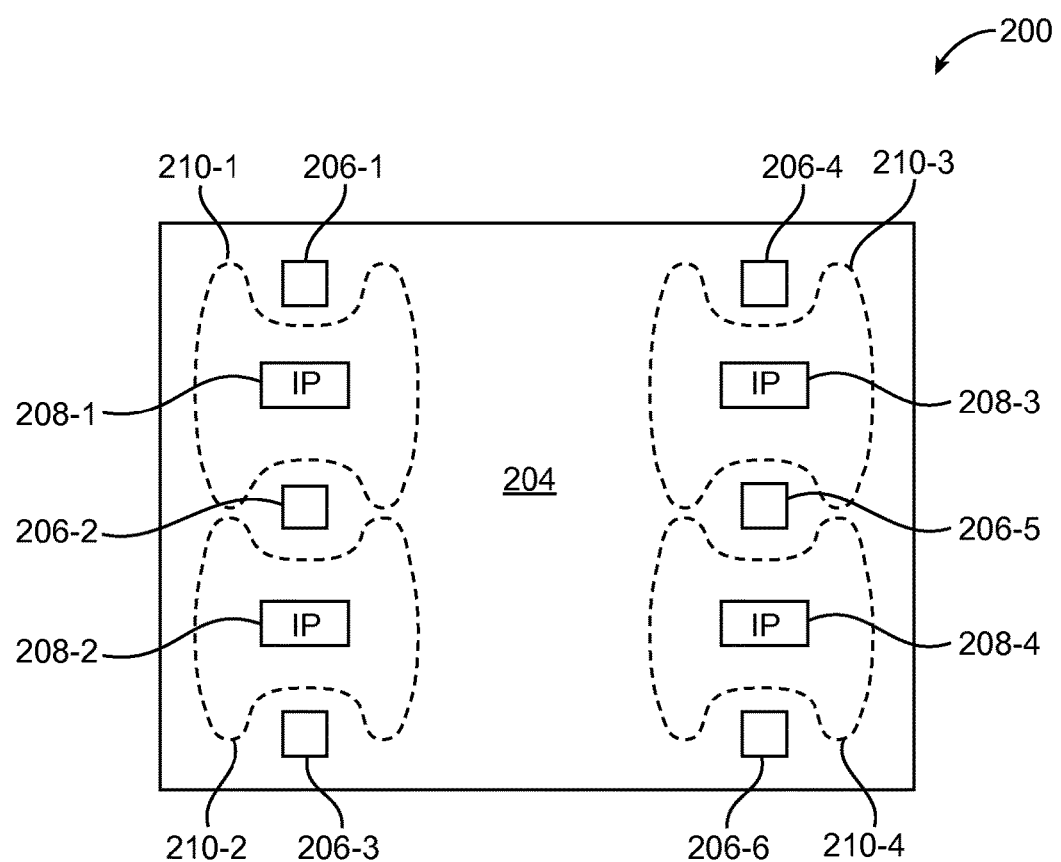
FIG. 2 is a diagram of a circuit design that includes multiple large intellectual property (IP) blocks.

Vertical interconnection resources 14 and horizontal interconnection resources 15 such as global and local vertical and horizontal conductive lines and buses may be used to route signals on PLD 10. Vertical and horizontal interconnection resources 14 and 15 include conductive lines and programmable connections between respective conductive lines and are therefore sometimes referred to as programmable interconnects. FIG. 2 illustrates a circuit design that includes large intellectual property (IP) blocks that are formed in the logic fabric 204 of a programmable circuit 200. Logic fabric 204 may include multiple LABs or logic sectors 11. Logic fabric 204 may be used to implement user logic, which in turn interfaces with IP blocks 208 such as eSRAM blocks, digital signal processing (DSP) cores, accelerator cores, Universal Interface Bus (UIB) blocks, Altera Interface Bus (AIB) blocks, or any other IP block.

The concentration of user logic around the IP blocks 208 may cause interconnect routing congestion in regions 210 that surround IP blocks 208, in traditional design architectures. Furthermore, routing resources would be used to route interconnections to the IP blocks 210 for the purpose of providing configuration messages to the IP blocks 208.

The routing congestion regions 210 may necessitate individual sectors 206 of the logic fabric 204 to use extended interconnection pathways to route signals to a desired location on the programmable circuit 200. The choice of interconnection paths available for routing signals from an individual sector 206 to an IP block 210 may be further complicated by circuitry that is formed adjacent to the IP blocks 210, that limits the amount of connections in the IP blocks 210 that are adjacent to sectors in the logic fabric 204.

Figure 3:
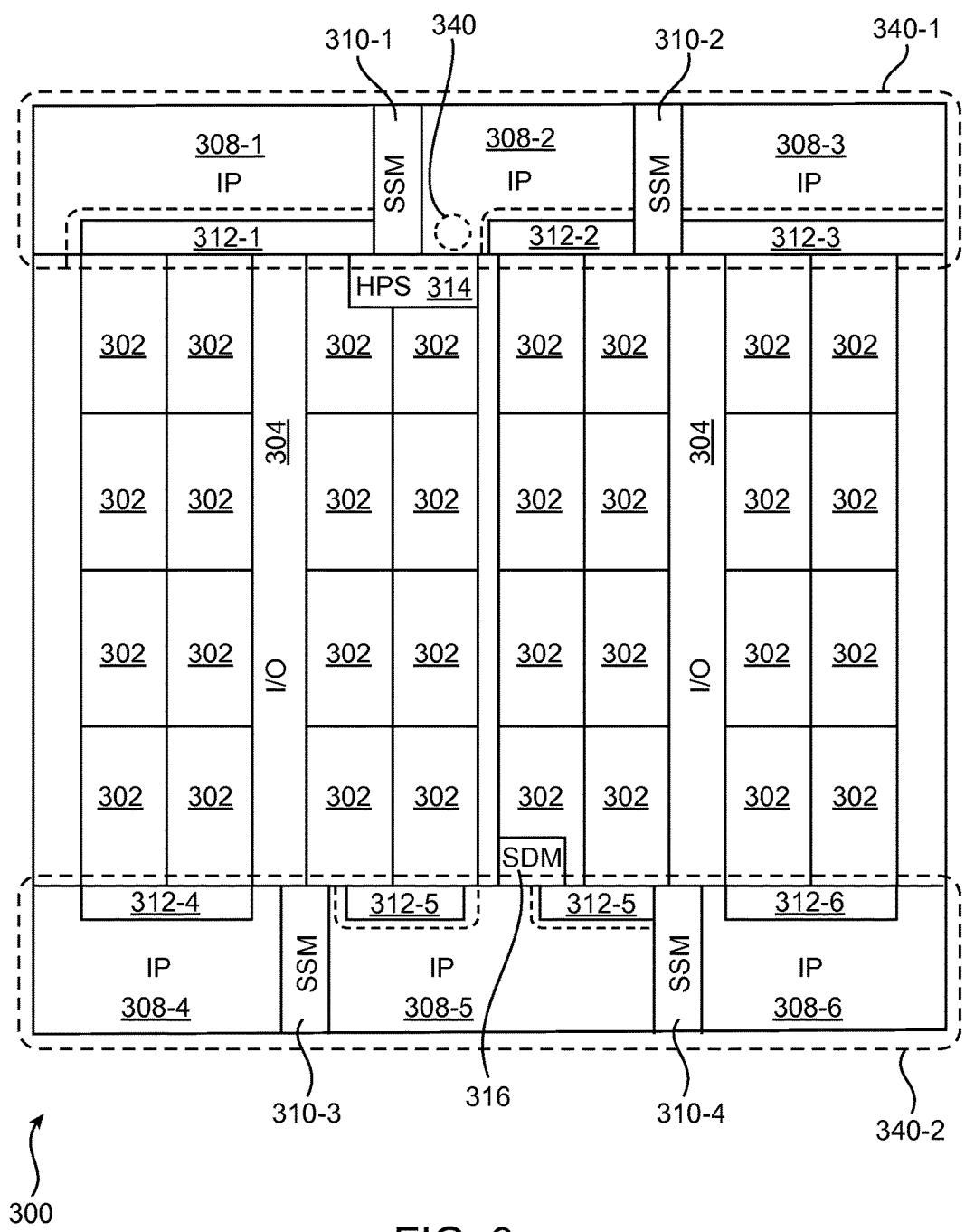
FIG. 3 is a diagram of a circuit design that provides a local configuration source and reroute layers for each of the IP blocks in a circuit in accordance with an embodiment.

FIG. 3 illustrates a design architecture in which a local configuration source 310 and reroute layers 312 are provided for each of the IP blocks. Sub-system managers (SSMs) 310 may be located adjacent to any one or any two IP blocks 308 in the logic region 300. SSMs 310 may serve as configuration sources for the channel reroute layers 312 (sometimes referred to herein as channel steering layers 312), and may also serve as configuration sources for the IP clocks 308 themselves. At any given time during the operation of the logic region 300, a logic sector 302 may provide or pass signals (such as access request signals, command signals, etc.) to any one, two, or more IP blocks 308.

The signals transmitted by a sector 302 to one or more IP blocks 308 may be intended to be received at a region of an IP block 308 (such as a blocked region 340 of IP block 308-2) that does not have a direct interface to any logic sector 302. Blocked regions such as region 340 of an IP block such as IP block 308-2 may not have direct interfaces to logic sectors 302. In other words, there may be blocked regions of an IP block 308 that are not directly adjacent to a logic sector 302.

Circuitry in such blocked regions of an IP block 308 may therefore have an interconnection port that is not directly accessible from an adjacent logic sector 302 via a vertical interconnection. Such blocked regions of an IP block 308 may be directly adjacent to other logical circuitry in the logic region 300. In the example of FIG. 3, the blocked region 340 is formed directly adjacent to the hard processor system (HPS) 314. Similarly, circuitry in blocked regions (not marked) of IP block 308-5 that are formed directly adjacent to a secure device manager (SDM) 316 may not be directly accessible from an adjacent logic sector 302 via a vertical interconnection.

FIG. 3 illustrates the HPS 314 and SDM 316 as occupying an area that is less than the area of a sector 302. However, this is merely illustrative. Circuitry such as HPS 314 and SDM 316 may occupy an area of an entire sector 302 or multiple sectors 302.

To allow circuitry in blocked regions of IP blocks 308 to be accessed, reroute layers 312 may be formed on or adjacent to IP blocks 308. A reroute layer 312 may be responsible for performing column steering using pipe-stages and multiplexers so that circuitry in any region of respective IP block 308 associated with the reroute layer 312, including blocked regions, can be accessed from the interface between the reroute layer 312 and a logic sector 302. Reroute layers 312, described in greater detail below in connection FIG. 4, may be configured by SSMs 310. Specifically, an SSM 310 associated with a reroute layer 312 may be used to load configuration data into the reroute layer 312 to specify a mapping between a first set of input-output connections to the reroute layer 312 from the logical fabric (i.e., logic sectors 302) and a second set of input-output connections to an IP block 308 associated with the reroute layer 312.

Reroute layer 312 may have a fixed mapping that is provided by a static configuration file (i.e., a configuration file that is not modified or replaced) throughout the normal operation of logic region 300. In certain embodiments where a fixed mapping on reroute layer 312, the configuration file may be automatically generated by a script running in the IP block 308 or the SSMs 310, or on another processing circuit that provides the script-generated configuration file to the SSM 310 for loading into the reroute layer 312. In other embodiments, the reroute layer 312 may have a dynamic mapping that is provided by multiple configuration files that are successively loaded into the reroute layer 312 to implement respective mappings between input-output connections of the reroute layer 312.

Figure 4:
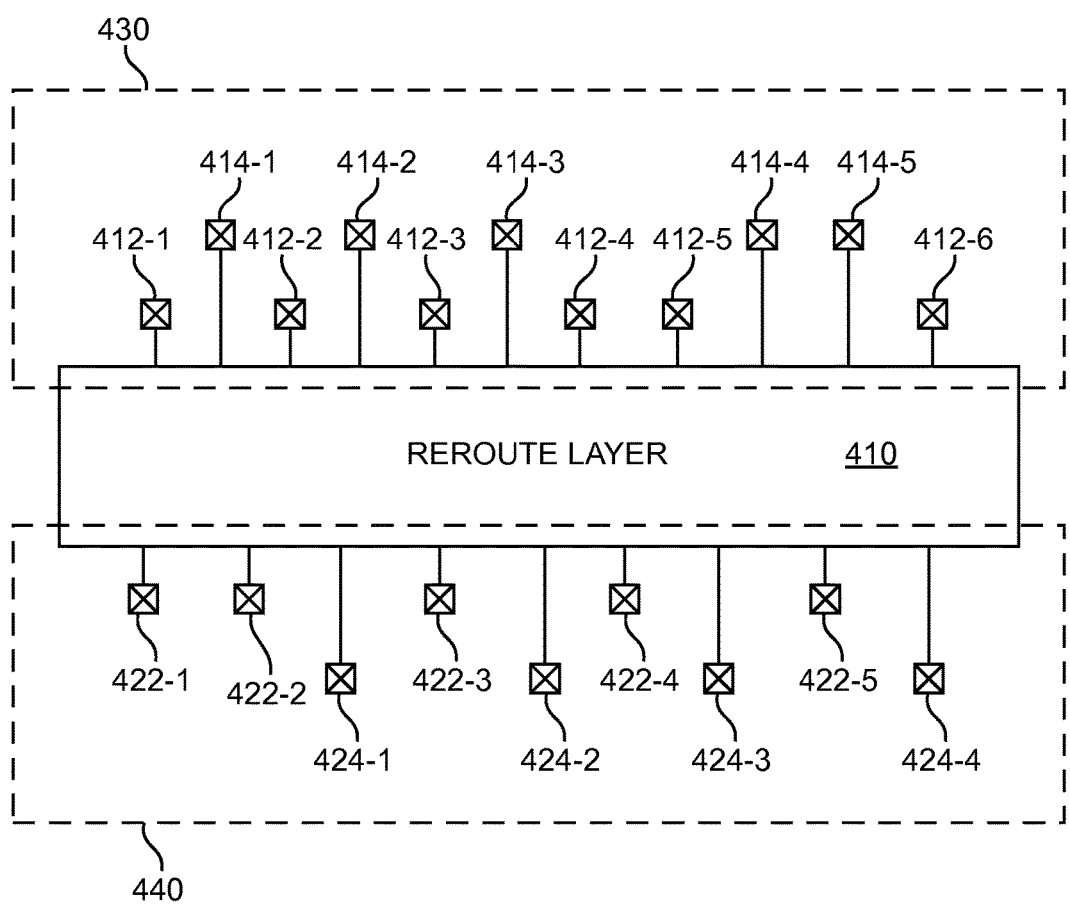
FIG. 4 is a diagram of a reroute layer in accordance with an embodiment.

Turning to FIG. 4, a reroute layer 410 that may be implemented as reroute layers 312 in FIG. 3 is illustrated. A first set of input-output connection terminals (sometimes referred to as "bi-directional connections" or simply "connections") in a reroute layer 410 may include the input-output connections 412 and 414 at a first interface 430 of the reroute layer 410.

Though referred to as bi-directional connections, the input-output connection terminals may be uni-directional or one-way connection terminals used only to receive or used only to provide signals to components. Some connection terminals in the reroute layer may have adjustable directionality that allows them to be used as bi-directional connection terminals, uni-directional connection terminals in a first direction (e.g., receiving signals at a first interface and providing them at a second interface), or uni-directional in a second direction that is opposite to the first direction (e.g., receiving signals at the second interface and providing at the first interface). Alternatively, some connection terminals in the reroute layer may have a fixed directionality and may be either bi-directional, uni-directional in a first direction, or uni-directional in a second direction that is opposite to the first direction. Connection terminals of the reroute layer 410 may be referred to as bi-directional connection terminals so as to not unnecessarily obscure the present embodiments, but may instead have the fixed or adjustable directionality described above.

The first set of bi-directional connection terminals 412 and 414 may be coupled to inputs or outputs of an IP block such as an IP block 308 in FIG. 3. An IP block 308 may include one or more sub-IP blocks. In embodiments where an IP block 308 includes two sub-IP blocks, the bi-directional connection terminals 412 and 414 at the first interface 430 of reroute layer 312 may be partitioned into a first subset 412 that is used to interface with circuitry in the first sub-IP block and a second subset 414 that is used to interface with circuitry in the second sub-IP block. In embodiments where an IP block 308 includes more than two sub-IP blocks, more than two partitions of bi-directional connection terminals may be provided at the first interface 430 of reroute layer 410.

The position of an individual bi-directional connection terminals 412 or 414 at the first interface 430 of reroute layer 410 may be aligned with a particular position in the IP block 308 where input signals are received or where output signals are produced. As an example, the circuitry in an IP block 308 that connects to bi-directional connection terminals 412-1 may be formed at an opposite end of the circuitry in the IP block 308 that connects to bi-directional connection terminals 412-6. In certain embodiments, the reroute layer 410 may extend across the entire length of the IP block 308 at the interface of the IP block 308 and the logic fabric of logic sectors 302. In other embodiments, the reroute layer 410 may extend across a portion of the length of the IP block 308 at the interface of the IP block 308 and the logic fabric of logic sectors 302.

IP blocks 308 or sub-IP blocks in an IP block 308 may have circuitry in predetermined positions, or in positions that cannot be modified. The spacing between the bi-directional connection terminals 412 and 414 may be based on or determined by the position of circuitry in the IP block 308 that is used to output signals to, or receive signals from the logic sectors 302. As an example, the spacing between bi-directional connection terminals 412 may correspond to the spacing between the circuitry in a first sub-IP block in IP block 308 that is used to produce output signals and receive input signals. Similarly, the spacing between bi-directional connection terminals 414 may correspond to the spacing between the circuitry in a second sub-IP block in IP block 308 that is used to produce output signals and receive input signals. Spacing between the connection terminals 412 and 414 at the first interface 430 of reroute layer 410 may correspond to or be determined by spacing of circuitry in a single sub-IP block in IP block, alternatively.

Connection terminals 422 and 424 at the second interface 440 of reroute layer 410 may have a spacing that is adjusted based on the predicted location of user logic in the logic sectors 302. As an example, the connection terminals 422 and 424 may be spaced to accommodate routing connections from multiple sectors 302 that are adjacent to unblocked portions of the IP block 308.

The second interface 440 of reroute layer 410 may include bi-directional connection terminals 422 and 424 that are connected to logic sectors 302 in the logic fabric of programmable circuitry 300. Specifically, user logic in the logic sectors 302 may provide or receive signals from one or more bi-directional connection terminals 422 and 424. Bi-directional connection terminals 422 may be associated with and used to route signals from a first sub-IP block in IP block 308, and bi-directional connection terminals 424 may be associated with and used to route signals from a second sub-IP block in IP block 308. Alternatively, signals from any sub-IP block in IP block 308 may be routed on any of the bi-directional connection terminals 422 or 424.

As described in connection with FIG. 3, the interface of an IP block 308 and the logic sectors 302 may be blocked in certain regions such as region 340 of IP block 308-2. In general, regions of an IP block 308 may be considered to be blocked if they are not directly adjacent to the logic fabric of logic sectors 302. When regions of an IP block 308 are blocked, a portion or subset of the connection terminals 422 and 424 at the second interface 440 of reroute layer 410 may also be blocked. In an example, bi-directional connection terminals 422-4, 422-5, 424-3, and 424-4 may be blocked in that they no longer share an interface with logic sectors 302. In other words, only the bi-directional connection terminals 422-1 through 422-3, 424-1, and 424-2 may be directly adjacent to the logic fabric of logic sectors 302, and able to access the user logic in the sectors 302.

However, the reroute layer 410 may be configurable, via subsystem managers 310 (SSMs 310), to implement a custom routing between the bi-directional connection terminals at the unblocked portions of the second interface 440 of reroute layer 410 and the bi-directional connection terminals at the first interface 430 of reroute layer 410 that are coupled to circuitry in an IP block 308. The reroute layer 410 may thereby allow all of the circuitry in an IP block 308 to be connected to the nearest sector 302 that is unblocked. In the example where bi-directional connection terminals 422-4, 422-5, 424-3, and 424-4 at the second interface 440 of reroute layer 410 may be blocked or may not be adjacent to a sector 302, the bi-directional connection terminals 412-1 through 412-3, 414-1, and 414-2 at the first interface 430 of reroute layer 410 that are above the blocked connection terminals of the reroute layer 410 may be accessible in certain configurations of the reroute layer 410.

Specifically, a SSM 310 may configure the reroute layer 410 to route signals from the bi-directional connection terminals 412-1 through 412-3, 414-1, and 414-2 at the first interface 430 of reroute layer 410 to the unblocked connection terminals 422-1 through 422-3, 424-1, and 424-2 at the second interface 440 of reroute layer 410. Reroute layer 410 may be dynamically configured by the SSM 310. Time division multiplexing may be used to route signals from a given number of connection terminals at the first interface 430 of layer 410 to a lower number of connection terminals at the second interface 440 of layer 410. Alternatively, the second interface 440 of reroute layer 410 may be provided with a greater number of bi-directional connection terminals to accommodate the routing of signals from all of the bi-directional connection terminals at the first interface 430 of reroute layer 410 with a dedicated bi-directional connection terminal at the second interface 440, even when portions of the reroute layer 410 and its associated IP block 308 are blocked.

Reroute layer 410 may, as an example, route the signals from connection terminal 412-1 at the first interface 430 to an unblocked connection terminal such as 424-4 at the second interface 440. In time division multiplexing schemes, the reroute layer 410 may route signals from a first connection terminal such as 412-1 at the first interface 430 to a given unblocked connection terminal such as 424-4 at the second interface 440 in a first interval. Subsequent to the first interval, the reroute layer 410 may be reconfigured to route signals from a second connection terminal such as 414-1 at the first interface 430 to the given unblocked connection terminal such as 424-4 at the second interface 440 for a second interval. Alternatively, there may be enough unblocked connection terminals at the second interface 440 such that an SSM 310 can configure the reroute layer 410 to route every connection terminal at the first interface 430 to a dedicated connection terminal at the second interface 440. Optionally, the reroute layer 410 may include pipelining registers that are used when routing signals between bi-directional connection terminals in the first and second interfaces 430 and 440. In this way, a SSM may configure a reroute layer 410 to route signals from all of the connections at the first interface 430 may be routed to unblocked connections at the second interface 440.

Returning to FIG. 3, once a mapping between a first set of input-output connection terminals of reroute layer 308 that are provided at the associated IP block 308 and a second set of input-output connections of reroute layer 312 that are provided at the logic sectors 302 of the logic fabric has been loaded into reroute layer 312, bi-directional signals may pass between the first and second sets of input-output connections, according to the mapping. As an example, if a first input-output connection terminal in the first set of input-output connection terminals of reroute layer 312 is mapped to a second input-output connection terminal in the second set of input-output connections of reroute layer 308, signals may be transmitted from the first input-output connection to the second input-output connection, or signals may be transmitted from the second input-output connection to the first input-output connection.

Even with routing blockages to IP blocks 308 such as those caused by circuitry such as HPS 314 and SDM 316, IP blocks 308-1, 308-2, and 308-5 can be integrated into a System in Package (SiP) strip 340 interposed between logic sectors 302 (i.e., the logic fabric). A SiP strip 340-1 may include the IP blocks 308-1 through 308-3 and the SSMs 310-1 and 310-2. The reroute layers 312-1 through 312-3 may be respectively coupled to the IP blocks 308-1 through 308-3 in the SiP strip 340-1. Similarly, SiP strip 340-2 may include IP blocks 308-4 through 308-6 and their respective reroute layers 312-4 through 312-6, along with SSMs 310-3 and 310-4.

The inclusion of SSMs 310 and the reroute layers 312 into the SIP strips 340 enable simplified integration of IP blocks 308 into logic fabric without disrupting the core fabric configuration. Because the user logic in logic sectors 302 can, via the reroute layers 312, route user logic signals to and receive signals from circuitry in any location of IP blocks 308, the integration of IP blocks 308 into the programmable circuitry 300 is simplified.

Subsystem managers 310 (SSMs 310) are configuration sources for the programmable circuitry 300, and may specifically be used in providing configuration data to the IP blocks 312. In traditional architectures, the configuration source would be located at a corner of the logic fabric (i.e., formed over one or more logic sectors 302), which would require interconnect routing from the configuration source to the various IP blocks 308 and the logic sectors 302. However, SSMs 310 reduce the interconnection demands of the configuration source by being formed directly adjacent to the IP blocks 308. SSMs 310 are thereby able to configure circuitry in IP blocks 308 without routing those signals through regions of user logic in the logic fabric of sectors 302. By reducing the interconnection demands of configuration sources, the interconnection density in the logic sectors 302 is reduced, which affords designers of programmable circuitry greater freedom in designing user logic in logic sectors 302.

Figure 6:
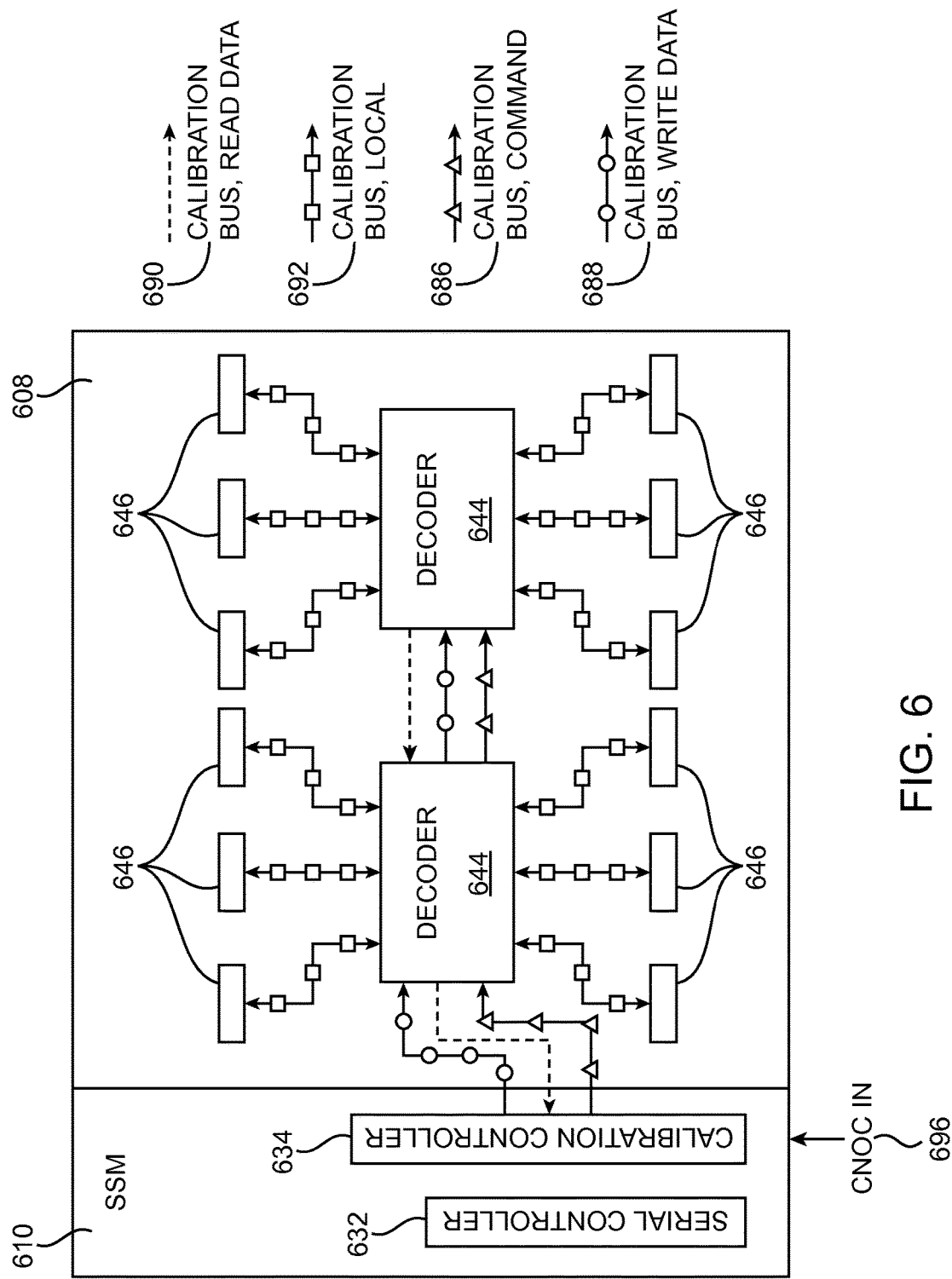
FIG. 6 is a diagram of a local configuration source that uses pipeline stages to address configuration endpoints in an IP block.

The SSMs 310 may themselves be considered a part of a Configuration Network on Chip (CNOC). The SSMs are themselves the source of providing configuration data to circuitry such as IP blocks 308. Secure device manager 316 may be used to relay the configuration data to the SSMs 310, but the SSMs 310 may be responsible for the actual configuration of IP blocks 308. SSMs may receive the configuration data to be used for IP blocks 308 via CNOC packets received at an input such as 696 as shown in FIG. 6. After an initial firmware configuration of a processor in the SSM 310 via a CNOC packet, the SSM 310 may be responsible for configuring attached or adjacent IP blocks 308 based on the firmware in the SSM 310.

Generally, IP blocks 308 may have differently configured SSMs 310, based on the functionality of the IP blocks 308. As an example, a SSM 310 coupled to and adjacent to an IP block 308 that is an eSRAM IP block would be configured differently than an SSM 310 coupled to and adjacent to an IP block 308 that is a digital signal processing (DSP) core IP block. As shown in FIG. 3, an SSM 310 may also be coupled to and be adjacent to two IP blocks 308. An SSM 310 may therefore be configured to run firmware that is specific to the pair of IP blocks 308 that are coupled to and adjacent to the SSM 310. Traditional designs of programmable circuitry employ a centralized configuration source that limits the placement of IP blocks to a region that is proximate to the centralized configuration source. By having SSMs 310 placed adjacent to IP blocks 308, the IP blocks 308 may be placed in any region of programmable circuitry, while remaining configurable by an adjacent SSM 310.

IP blocks 308 may include eSRAM blocks, digital signal processing (DSP) cores, accelerator cores, Universal Interface Bus (UIB) blocks, Altera Interface Bus (AIB) blocks, or any other IP block. By providing a SSM 310 adjacent to a given IP block 308, the configuration of a SSM 310 may be performed locally with minimal, if any, core logic routing resources. In the architecture of programmable circuitry 300, the IP blocks 308 may be configured by an adjacent SSM 310 without the configuration data needing to flow through an interconnect pathway through the sectors 302 that connects a centralized configuration source to the IP block 308.

SSMs 310 may include processor circuitry that enables smart or active configuration of IP blocks 308, and may also have a soft firmware core that may be programmed in an initialization mode of programmable circuitry 300. The firmware core of a SSM 310 may direct the processor circuitry in the SSM 310 to implement a certain operation of functionality. By reprogramming or configuring the firmware core of a SSM 310, the functionality or operation of the SSM 310 may be controlled.

SSMs 310 may provide a configuration clock signal to the IP blocks 308. In other words, the clock signal provided by SSMs 310 may correspond to the clock associated with signals used in the transfer of configuration data from the SSMs 310 to associated IP blocks 308. The functional clock of the IP blocks 308 may reside within the IP blocks 308 themselves.

Figure 5:
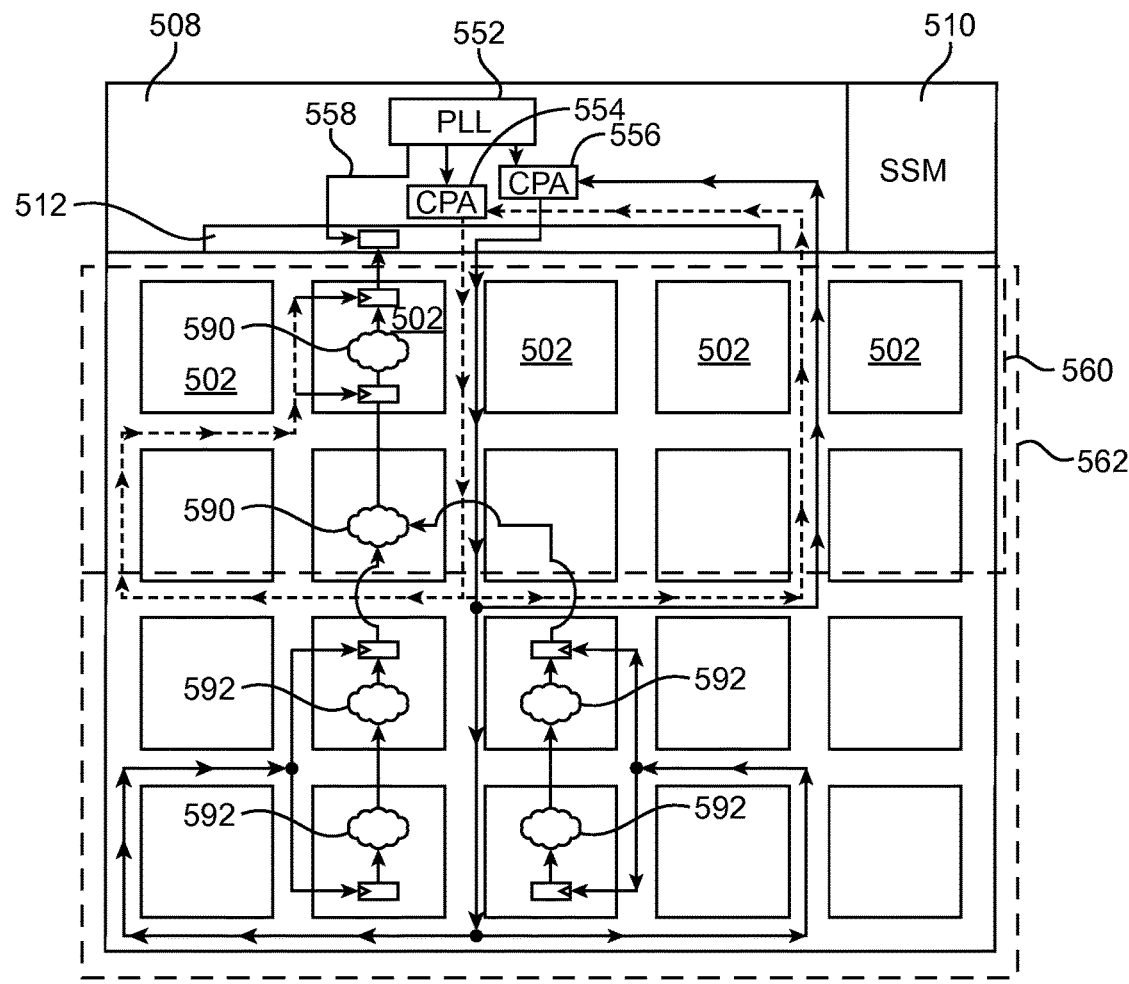
FIG. 5 is a diagram of clock routing programmable circuitry that interfaces with an IP block utilizing multiple rate clock signals.

Turning to FIG. 5, which illustrates the functional clock of an IP block 508, it can be seen that the clock 552 used for the functioning of IP block 508 is placed within the area of IP block 508. Clock 552 is represented as a phase-locked loop 552 in the embodiment of FIG. 5, however clock 552 may be any other suitable clock circuitry. The clock 552 may provide multiple clock output signals. A first clock output signal from clock 552, shown in FIG. 5 to be received at the clock phase alignment (CPA) circuitry 554, may be a full rate clock. IP block 508 may also use a full rate clock signal produced at a different output of clock 552 (such as output line 558) to clock circuitry within the IP block 508 itself. A second clock output signal from clock 552, shown in FIG. 5 to be received at the CPA circuitry 556, may be a divide-by-N rate clock with a clock frequency that is less than the full rate clock of the first clock output signal by an integer factor N. As an example, the second clock output signal from clock 552 may be a half-rate clock (when N is 2) or a quarter-rate clock (when N is 4). Generally, N can have any value, and the frequency of the second clock output signal can be less than the full rate clock frequency by any integer multiple.

Clock 552's first clock output signal, or the full rate clock signal, may be restricted to, or only provided to logic sectors 502 that are in a first region 560 that is adjacent to the interface of the logic sectors 502 and the IP block 508. The first region 560 may include two rows of sectors 502 as shown in FIG. 5, but could alternatively include one, three, four, five, or any number of sectors 502. It may be desirable to limit the amount of rows in the first region 560 based on the area of the sectors 502. Providing a full rate clock signal having a frequency that is the same as the operating frequency of the IP block 508 allows IP block 508 and certain sectors of user logic 590 in region 560 to communicate at a higher frequency of user logic than traditional systems. In traditional systems, a full rate clock would not be provided to sectors 502 because of clock uncertainty caused by the routing of clock signals over large interconnect lengths connecting sectors 502.

Running certain sectors 502 in region 560 with a full rate clock signal is possible because the area of region 560 is limited to regions where the clock uncertainty in the signal received at the sectors 502 is acceptable or manageable at the full rate, to ensure synchronous communication between the IP block 508 and the sectors 502 in region 560 is ensured and maintained.

IP blocks 508 may have certain bandwidth requirements when communicating with sectors 502. By routing a full rate clock signal to selected sectors 502 in region 560, the amount of interconnect wires that need to be routed from the IP block 508 to sectors 502 may be reduced, compared to traditional systems in which only a divide by N clock signal would be routed to sectors 502. Because a higher communication frequency can be used to satisfy a given bandwidth requirement with less wires or channels compared to what a low communication frequency requires to full fill the given bandwidth requirement, the embodiment of FIG. 5 may enable higher frequency communications between sectors 502 and the IP block 508, and may also reduce the interconnection congestion around the IP block 508.

Clock phase alignment circuit 554 (CPA 554), which outputs the full rate clock signal, also receives a drop-back clock signal that has been routed to the logic fabric of sectors 502, but is not utilized for clocking user logic. As shown in FIG. 5, the CPA 554 may produce a clock signal that is routed below the second row of sectors 502, where one path branches to the left and is provided to user logic in a sector 502, and where another path branches to the right and is provided to the CPA 554. The path that branches to the right may be used to convey what is known as the drop-back clock signal. CPA 554 is used to align the phase of the clock output to sectors 502 to clock user logic with the phase of the drop-back clock signal that is routed to a distance within the logic fabric of sectors 502 and then back to the CPA 554.

CPA 554 minimizes or eliminates the clock skew that degrades the timing margin or the maximum operable frequency (sometimes referred to herein as "Fmax") that user logic can operate at when interfacing with the IP block 508. CPA 554 may compensate the skew of the drop-back clock signal that is routed to the logic fabric over a given distance of interconnect routing resources, by using the signal that is input to the CPA 554 from PLL 552 as a reference signal. The reference signal used by the CPA 554 that is used to align the drop-back full rate clock signal routed to region 560 may be the full-rate clock signal used to clock circuitry on the particular IP block 508 but that has not been routed to any of the sectors 502, such as the full rate clock output on line 558 by clock 552.

Clock 552's second clock output signal, that is output to CPA 556, may be a divide-by-N clock signal. As shown in FIG. 5, the CPA 556 may produce a clock signal that is routed below the fourth row of sectors 502, where one path branches to the left and is provided to user logic 592 in a sector 502 in the region 562, and where another path branches to the right and is provided to the CPA 556. The path that branches to the right may be carry a drop-back divide-by-N clock signal.

Clock phase alignment circuit 556 (CPA 556), which outputs the divide-by-N rate clock signal, also receives a drop-back divide-by-N clock signal that has been routed to the logic fabric of sectors 502 in region 562, but that is not utilized for clocking user logic 592. CPA 556 is used to align the phase of the divide-by-N clock output to sectors 502 to clock user logic 592 in region 562, with the phase of the drop-back divide-by-N clock signal that is routed to a distance within the logic fabric of sectors 502 and then back to the CPA 556. The reference signal used by the CPA 556 that is used to align the drop-back divide-by-N clock signal from region 562 may be the full-rate clock signal used to clock circuitry on the particular IP block 508 but that has not been routed to any of the sectors 502, such as the full rate clock output on line 558 by clock 552.

Both of the CPAs 554 and 556 may, through comparing at least one of the clock signals provided by clock 552 and their respective drop-back clock signals that are received via longer interconnect paths in the logic fabric of sectors 502, be able to infer the delay of the clock signal paths in respective regions 560 and 562 of the logic fabric of sectors 502. Because the delay associated with traversing one sector is known, the CPAs 554 may be able to determine the delay of the clock path originating at IP block 508 that is used to clock user logic in regions 560 and 562. Because the interconnect paths used to route the drop-back signals are matched with the interconnect paths used to route the clock signals to user logic in sectors 502, the timing information that is determined by comparing the drop-back signal to the clock 552 signal at CPAs 554 and 556 may accurately reflect the user logic clock path delay.

Delay elements in the CPAs 554 and 556 may be used to compensate for the clock skew and uncertainty on clock signal paths that are used to clock user logic 590 and 592 in regions 560 and 562, based on the comparison of the clock 552 and the drop-back clock signals. Minimizing the clock skew and uncertainty using CPAs 554 and 556 enables high-frequency communications between an IP block 508 and user logic in sectors 502. By configuring delay elements in CPAs 554 and 556 to selectively compensate or minimize clock skew and uncertainty in clock signals routed to the user logic in sectors 502, the communication frequency in both the full rate clock provided to logic in region 560 and the divide-by-N rate clock provided to logic in region 562 may be increased. The divide-by-N rate clock may also be aligned to the full rate clock, as the divide-by-N rate clock has an integer multiple period of the full rate clock. By aligning the divide-by-N rate clock to the full rate clock, synchronous transfer between logic clocked by the two clock signals may be ensured or enabled.

Generally, because the clock signal routed to region 562 is a divide-by-N clock signal with a lower frequency than the full rate clock signal, it is possible to route the divide-by-N clock signal to sectors 502 in region 562 that are further from clock 552 than the sectors 502 in region 560, while maintaining a manageable clock uncertainty and skew that can be corrected to ensure synchronous communication. Both the full rate clock that is used to clock user logic in sectors 502 of region 560 and the divide-by-N rate clock that is used to clock user logic in sectors 502 of region 562 may be routed to the logic fabric of sectors 502 via the reroute layer 512 associated with IP block 508. The clock 552 in IP block 508 may generally provide a first clock such as a full rate clock to a first subset of sectors 502 in a first region 560 that is adjacent to the IP block 508, and may provide a second clock such as a divide-by-N clock that has a frequency less than the frequency of the first clock to a second subset of sectors 562 in a second region 562 that is adjacent to the first region 560.

A full rate clock provided by clock 552 in IP block 508 may be routed such that the use of the full rate clock is confined to only sectors 502 in the first region 560 that is adjacent to the IP block 508, or more generally, sectors 502 that are located within a first number of rows adjacent to the IP block 508. A divide-by-N clock provided by clock 552 in IP block 508 may be routed such that the use of the full rate clock can be used by sectors 502 in both the first region 560, the second region 562, and logic sectors 502 beyond the first and second regions 560 and 562. Routing the divide-by-N clock in this way limits the clock tree length and allows for higher frequency transfers between the IP block 508 and logic sectors 502 outside the first region 560, which may receive the full rate clock signal from clock 552 in IP block 508.

FIG. 6 is a detailed view of a subsystem manager 510 (SSM 510) that is associated with an adjacent IP block 508. SSM 510 may include a serial controller 532 and a calibration controller 534 that are used to configure the IP block 508. SSM 510 may be a calibration source for the IP block 508, thereby reducing the complexity associated with reconfiguration paths that include or pass through interconnections or regions in the logic fabric of sectors 302 in FIG. 3.

Because the IP block 508 may be physically very large, it may be desirable to serially connect pipeline stages 644 to the configuration SSM 610. The diagram of FIG. 6 illustrates pipeline stages 644 as pipelined decoder stages, but in embodiments where smart configuration that requires decoding is not required, stages 644 may be simple pipeline stages without decoding capabilities. The introduction of pipelined stages 644 allows for timing closure in the SSM 610 to easily be achieved, which increases the maximum operating frequency Fmax at which the SSM 610 can be operated.

The inclusion of pipeline stages 644 may also prevent message collision when signals are propagating across or traversing the length of interconnections from the SSM 610 and an edge of the IP block 608. As an example, when read data is propagating through the pipeline stages 644, the read data may be selectively delayed. The delay applied to read data may be based on the distance of the pipeline stage 644 from the SSM 610. Generally, when data is read from endpoints 646 that are coupled to different pipeline stages 644, one of the pipeline stages 644 may be provided with a programmed delay that is different from the programmed delay of the other pipeline stages 644, to ensure that as the read data is traversing the read data path from a given endpoint 646 to the SSM 610, that the read data from other endpoints 646 traveling to the SSM 610 do not conflict with, or interfere with the read data from the given endpoint 646. Endpoints 646 may be written into in configuration modes of the SSM 610, but they may also be read from in calibration modes of the SSM 610. Notably, for IP blocks 608 that do not have built-in calibration, the SSM 610 may be used to receive read data from the endpoints 646 to ensure that the configuration of the endpoints 646 is accurate.

Each pipeline stage 644 may include programmable delay elements that can be configured to exhibit variable delays based on the destination address of a configuration message. The delay exhibited by a programmable delay element in the pipeline stage 644 may alternatively be based on the total number of pipeline stages 644 associated with a given SSM 610. The delay exhibited by programmable delay elements in the pipeline stage 644 may be programmed or loaded into the programmable delay element via a serial configuration controller that is coupled to the programmable delay element.

When pipeline stages 644 are implemented as pipelined decoder stages, the pipelined decoders 644 may be used for addressing address memory mapped devices. As an example, the endpoints 646 in the IP block 608 may have multiple registers that govern the functionality or behavior of the IP block 608. Configuring the registers in the endpoints 646 may be referred to as configuring the IP block 608. When addressing the registers as elements in a memory mapped space, decoding functions in the pipelined decoders 644 may be utilized to ensure that the proper endpoint 646 registers are configured or written into.

As an example, each pipelined decoder 644 may be provided with an addressing range. Endpoints 646 that are associated with and coupled to a given pipelined decoder 644 may each have a unique address mapping. In other words, each endpoint 646 may be individually addressed with a unique address. Alternatively, subsets of the endpoints 646 associated with and coupled to a given pipelined decoder 644 may be mapped using the same address. Such endpoints 646 that are mapped to the same address may be configured simultaneously by a pipelined decoder 644. In certain embodiments, multiple pipelined decoder 644 may be coupled to endpoints having the same address in the memory mapped address space. Generally, when a single given address in the memory mapped address space is assigned to multiple endpoints 646 associated with and coupled to one or more pipelined decoders 644, the multiple endpoints 646 may correspond to write-only registers. When the endpoints 646 are associated with a single address, and therefore accessed simultaneously by their respective pipelined decoders 644, it may be desirable to only write to the endpoints 646.

Pipeline stages 644 may generally increase the frequency at which configuration, or re-configuration messages can be sent to an IP block 608. In traditional systems, configuration messages would need to be routed via I/O buses 304 that span the lengths of multiple sectors 302 in the example of FIG. 3. The lengthy signal path would limit the rate/frequency at which synchronous transfer could be ensured by meeting the timing closure at the rate/frequency. However, because the SSM 610 that is adjacent to the IP block 608 is providing the configuration data to IP block 608 via pipeline stages 644, the timing closure for configuration or re-configuration messages can be met at any desired frequency.

Pipeline stages 644 may be used to route local configuration messages 692 that are based on calibration bus messages 686 and 688, to the endpoints 646 in the IP block 608. Endpoints 646 may be read or addressed via pipeline stages 644 and may produce read data 690 that is received at the SSM 610. As shown in FIG. 6, calibration controller 634 in SSM 610 may receive the read data 690, and may provide the command and write data messages 686 and 688 to the pipeline stages 644. Serial controller 632 may be used to interface with serial interfaces outside of IP block 608 (not shown).

The foregoing is merely illustrative of the principles of this invention and various modifications can be made by those skilled in the art without departing from the scope and spirit of the invention. The foregoing embodiments may be implemented individually or in any combination.

What is claimed is:

1. An integrated circuit, comprising:
   a plurality of programmable logic blocks;
   an intellectual property (IP) circuit block that is adjacent to at least one of the plurality of programmable logic blocks and that comprises a plurality of endpoints;
   a local configuration source that is adjacent to the IP circuit block and that is used to address the plurality of endpoints in the IP circuit block; and
   a pipeline stage that is coupled to the plurality of endpoints and that routes access commands from the local configuration source to at least one of the plurality of endpoints.

2. The integrated circuit defined in claim 1, wherein the plurality of endpoints are assigned an address based on a memory mapping, and wherein the pipeline stage comprises:
   a pipeline decoder circuit that receives memory mapped address for an endpoint from the local configuration source and that addresses the endpoint by decoding the memory mapped address.

3. The integrated circuit defined in claim 2, wherein the pipeline decoder circuit comprises:
   a programmable delay element that exhibits a delay that is based on the distance of the pipeline decoder circuit from the local configuration source.

4. The integrated circuit defined in claim 3, wherein the pipeline decoder circuit comprises a first pipeline decoder circuit, wherein the programmable delay element comprises a first programmable delay element, and wherein the integrated circuit further comprises:
   a second pipeline decoder circuit that is interposed between the first pipeline decoder circuit and the local configuration source, wherein the second pipeline decoder circuit comprises:
      a second programmable delay element that exhibits a delay that is different than the delay exhibited by the first programmable delay element.

5. The integrated circuit defined in claim 2, wherein the local configuration source reads from the plurality of endpoints during a calibration mode of the integrated circuit.

6. The integrated circuit defined in claim 1, wherein the local configuration source addresses a subset of the plurality of endpoints using a single address.

7. Programmable circuitry, comprising:
- logic fabric having programmable blocks arranged in rows and columns;
- an intellectual property (IP) circuit block having multiple endpoints and a clock generator that provides at least one clock signal to the logic fabric;
- a local configuration source having a configuration clock generator that generates a configuration clock signal for configuring the IP circuit block, wherein the local configuration source addresses the multiple endpoints in the IP circuit block; and
- a pipeline stage that is coupled to the multiple endpoints and that routes access commands from the local configuration source to at least one of the plurality of endpoints.

8. The programmable circuitry defined in claim 7, wherein the at least one clock signal comprises a full-rate clock signal, wherein the programmable circuitry comprises:
- an interconnect path that routes the full-rate clock signal to a region of the logic fabric that is adjacent to the IP circuit block, wherein the region of the logic fabric is bounded by a row of programmable blocks in the logic fabric.

9. The programmable circuitry defined in claim 7, wherein the region of the logic fabric comprises:
- user logic at a given row of the logic fabric that is clocked by the full-rate clock signal; and
- a drop-back signal path that extends to the given row and that feeds back into the IP circuit block.

10. The programmable circuitry defined in claim 9, wherein the IP circuit block comprises:
- clock phase alignment circuitry that receives a drop-back signal from the drop-back signal path and that adjusts the full-rate clock signal based on the drop-back signal.

11. The programmable circuitry defined in claim 7, wherein the at least one clock signal further comprises a divide-by-N clock signal that is based on the full-rate clock signal, wherein the interconnect path comprises a first interconnect path, wherein the region of the logic fabric comprises a first region, and wherein the programmable circuitry further comprises:
- a second interconnect path that routes the divide-by-N clock signal to a second region of the logic fabric that is adjacent to the first region of the logic fabric.

12. The programmable circuitry defined in claim 11, wherein the second region of the logic fabric comprises:
- user logic at a given row of the logic fabric that is clocked by the divide-by-N clock signal; and
- a drop-back signal path that extends to the given row and that feeds back into the IP circuit block.

13. The programmable circuitry defined in claim 12, wherein the IP circuit block comprises:
- clock phase alignment circuitry that receives a drop-back signal from the drop-back signal path and that adjusts the divide-by-N clock signal based on the drop-back signal.

14. Circuitry, comprising:
- an array of programmable logic blocks;
- an intellectual property (IP) block having multiple endpoints that is adjacent to the array of logic blocks;
- a pipelined reroute layer having a first set of connections between a first interface of the reroute layer and the multiple endpoints in the IP block, and further having a second set of connections between a second interface of the reroute layer and the array logic blocks, wherein the first set of connections has a first connection density that is higher than a second connection density of the second set of connections; and
- a local configuration source that addresses the multiple endpoints in the IP block and that configures the pipelined reroute layer to map a first connection at the first interface to a second connection at the second interface, and wherein the pipelined reroute layer routes signals between the first and second connections.

15. The circuitry defined in claim 14, wherein the IP block has a plurality of connections, and wherein the first interface of the reroute layer comprises:
- connection terminals that are aligned with the plurality of connections in the IP block.

16. The circuitry defined in claim 14, wherein the second connection is the closest connection at the second interface to the first connection at the first interface.

17. The circuitry defined in claim 14, wherein a portion of the second interface is obstructed from directly interfacing with the array of logic blocks, and wherein the first connection is formed opposite the obstructed portion of the second interface.

* * * * *